United States Patent
Bell

(10) Patent No.: US 6,615,393 B1
(45) Date of Patent: Sep. 2, 2003

(54) METHOD AND APPARATUS FOR PERFORMING ELECTRICAL DISTANCE CHECK

(75) Inventor: Risto Bell, San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 125 days.

(21) Appl. No.: 09/891,768

(22) Filed: Jun. 25, 2001

(51) Int. Cl.[7] .................................................. G06F 9/45
(52) U.S. Cl. ............................... 716/5; 716/19; 430/30
(58) Field of Search .......................... 716/2, 5, 8, 19, 716/20, 21; 430/5, 22, 30

(56) References Cited

U.S. PATENT DOCUMENTS

| | | | | |
|---|---|---|---|---|
| 5,663,893 A | * | 9/1997 | Wampler et al. | 716/19 |
| 5,689,433 A | * | 11/1997 | Edwards | 716/2 |
| 5,900,340 A | * | 5/1999 | Reich et al. | 430/22 |
| 6,044,208 A | * | 3/2000 | Papadopoulou et al. | 716/4 |
| 6,077,310 A | * | 6/2000 | Yamamoto et al. | 716/19 |
| 6,324,673 B1 | * | 11/2001 | Luo et al. | 716/11 |
| 6,341,366 B1 | * | 1/2002 | Wang et al. | 716/11 |
| 6,357,036 B1 | * | 3/2002 | Eka et al. | 716/15 |
| 6,523,162 B1 | * | 2/2003 | Agrawal et al. | 716/19 |

* cited by examiner

Primary Examiner—John F. Niebling
Assistant Examiner—Stacy Whitmore
(74) Attorney, Agent, or Firm—Wagner, Murabito & Hao LLP

(57) ABSTRACT

A method and apparatus for verification of a semiconductor device design is disclosed that includes the determination of electrical distance for shapes of a design of a semiconductor device. In the present embodiment, the method includes, for each shape to be analyzed, growing from a seed disposed within a boundary shape to be analyzed. After each new growth step, a frontier edge or a frontier polygon is generated. No frontier edges or frontier polygons result from growth steps relating to boundary shapes that have fully traversed. Therefore, as each smaller shape is traversed, growth within the traversed shape is discontinued (no frontier edges or frontier polygons result). Thus, the growth regions of smaller shapes that have been traversed drop out, and are not included in subsequent growth steps, advantageously reducing memory requirements and run-time.

26 Claims, 32 Drawing Sheets

300

500

```
┌─────────────────────────────────────────┐
│ DETERMINE DISTANCE LEFT AND MAXIMUM STEP SIZE │
│                  501                    │
└─────────────────────────────────────────┘
                    ↓
┌─────────────────────────────────────────┐
│ GROW SEEDS BY MAXIMUM STEP SIZE (AND SAVE THE RESULTING │
│        SHAPES AS FIRST SHAPE SET)       │
│                  502                    │
└─────────────────────────────────────────┘
                    ↓
┌─────────────────────────────────────────┐
│   REDUCE DISTANCE LEFT BY MAXIMUM STEP SIZE   │
│                  503                    │
└─────────────────────────────────────────┘
                    ↓
┌─────────────────────────────────────────┐
│ DETERMINE FRONTIER POLYGONS FOR SHAPES RESULTING FROM │
│ STEP 502 (BY DROPPING PORTIONS OF GROWTH RESULTING FROM │
│ STEP 502 THAT EXTEND BEYOND BOUNDARY SHAPES) AND SAVE │
│           FRONTIER POLYGONS             │
│                  504                    │
└─────────────────────────────────────────┘
                    ↓
            ╱ HAS DISTANCE LEFT ╲   YES    ┌──────────────┐
           ╱   REACHED ZERO?     ╲────────→│ FLAG ERROR FOR│
           ╲        505          ╱         │   FRONTIER   │
            ╲                   ╱          │  POLYGONS THAT│
             ╲                 ╱           │ HAVE NOT YET │
                    ↓ NO                   │   REACHED    │
                                           │ BOUNDARY EDGES│
                                           │     512      │
                                           └──────────────┘
┌─────────────────────────────────────────┐
│          DETERMINE STEP SIZE            │
│                  506                    │
└─────────────────────────────────────────┘
                    ↓
┌─────────────────────────────────────────┐
│ GROW FRONTIER POLYGONS BY DETERMINED STEP SIZE IN ALL │
│ DIRECTIONS AND SAVE THE RESULTING SHAPES AS SECOND SHAPE │
│                   SET                   │
│                  507                    │
└─────────────────────────────────────────┘
                    ↓
┌─────────────────────────────────────────┐
│ DETERMINE TEMPORARY FRONTIER POLYGONS (BY DROPPING │
│ THOSE PORTIONS OF THE SHAPES RESULTING FROM STEP 507 │
│       THAT OVERLAP FIRST SHAPE SET)     │
│                  508                    │
└─────────────────────────────────────────┘

☐ AIN   ☐ BIN   ⌐ ⌐ OUT

OUT = AND (AIN, BIN)

OUT = ANDNOT (AIN, BIN)

OUT = SIZE (AIN, 1.5)

METHOD AND APPARATUS FOR PERFORMING ELECTRICAL DISTANCE CHECK

TECHNICAL FIELD

This invention relates to the field of semiconductor design. More specifically, the present invention relates to a method and apparatus for design verification.

BACKGROUND ART

Semiconductor fabrication processes include an initial design phase in which the circuitry is designed. Final layout assembly and verification is then performed for each new design. Only after the verification process has been successfully completed, can the semiconductor device fabrication process begin.

The complexity of semiconductor devices has risen exponentially in recent years, primarily as a result of increases in the number of transistors packaged on each semiconductor device. This has resulted in a corresponding increase in the development cycle. In particular, this increased complexity has significantly increased the time required to perform final layout assembly and verification for each new design. This stretches the development cycle and escalates verification run-times that are essential to ensure zero defects prior to fabrication.

Prior art verification cycles typically include numerous error correction and verification runs on the entire integrated chip. Because of the extensive amount of time required for each verification run, prior art processes for final layout assembly and verification of a very complex chip can take as long as twenty days to complete.

However, market forces dictate that semiconductor developers bring products quickly to market. This creates a need to shorten the time required to bring each new design of a semiconductor device to market and hence, a need to shorten the error correction and verification cycle.

In response to the need to shorten the verification cycle, various software programs have been developed for speeding up the error correction and verification process. These recent software programs have significantly decreased the run time for software verification. However, because of the continuing increase in the complexity of semiconductor designs, the sheer volume and complexity of data overwhelms many of the software programs that have been developed for speeding up the error correction and verification process, resulting in long run-times.

The use of faster microprocessors has also resulted in improvements to run time. In addition, programs have been recently introduced that run on multiple microprocessors. However, the use of fast microprocessors and the use of multiple fast microprocessors is expensive. In addition, as the complexity of semiconductor designs continues to increase, the processing power of multiple fast microprocessors may not be enough to maintain sufficiently fast run-times.

One step in the verification process includes the determination of the maximum spacing within or around a layer. This step is typically referred to as an electrical-distance check. Electrical-distance checks in physical verification (latchup) require large run-times and memory. Conventional tools for performing an electrical-distance check grow seed shapes using a repetitive iteration until the size of the seed shape reaches a limit, commonly referred to as the maximum distance. The process can be either inside or outside a shape set of interest. Each sizing is limited to avoid crossing the space or the notch of a barrier. At each iteration, the seed shapes represent the complete area that has been traversed during the growth.

FIG. 1 shows an exemplary conventional art electrical-distance check growth iteration that includes shape 102 and shape 103. In the example of Conventional Art FIG. 1, seed shape 104 and seed shape 105 are grown through N iterations until sizing Sn is reached. At iteration 5 the growth reaches the size of the smaller shape 102. However, in conventional processes, growth continues until iteration Sn. At iteration Sn, an error condition is reached as a result of the boundaries of shape 103 exceeding the sizing. An error report is then generated that indicates the portion of shape 103 not meeting the electrical distance check criteria. In this process, each iteration represents the complete area traversed.

Though the growth of the seed shape such that the seed shape represents the complete area that has been traversed during the growth gives accurate results, it requires the processing of a large amount of data. In addition, small barrier shapes, once fully traversed, wastefully participate in remaining cycles though they can grow no further. More particularly, in the example of Conventional Art FIG. 1, all growths within shape 102 following iteration 5, wastefully participate in future growth (e.g., iteration 6 through iteration N).

Thus, what is needed is a method and apparatus for bounded sizing of shapes that can efficiently determine sizing of shapes for verification of a semiconductor device design. In addition, a method and apparatus is needed that performs an electrical distance check quickly and accurately. In addition, a method for verification of semiconductor device design is needed that meets the above needs and that is not overwhelmed by the sheer volume and complexity of data that is required to be processed.

DISCLOSURE OF THE INVENTION

The present invention provides a method and apparatus for verification of a semiconductor device design that quickly and accurately processes data. In addition, the method and apparatus of the present invention is not overwhelmed by the sheer volume and complexity of data that is required to be processed.

A method and apparatus for verification of a semiconductor device design is disclosed that includes the determination of electrical distance for shapes within a design of a semiconductor device. In the present embodiment, the method includes growing each of a plurality of seeds to generate a first shape set that includes a plurality of shapes. Frontier edges are then determined for each shape within the first shape set. The frontier edges are then saved.

Each of the frontier edges are grown to generate a second shape set. Predetermined operations are performed on the second shape set to obtain frontier edges such that no frontier edges are determined for boundary shapes that have been fully traversed. The frontier edges are then saved. The first shape set is then replaced with the second shape set. The steps of growth of frontier edges to generate a second shape set; determining frontier edges; and saving frontier edges, is continued as long as the process produces at least one frontier edge or until growth has reached the electrical-distance to be tested for.

In another embodiment, frontier polygons are determined from the first shape set, and each frontier polygon is grown to generate a second shape set. Predetermined operations are performed on the second shape set to obtain frontier polygons such that no frontier polygons are determined for boundary shapes that have been fully traversed. The frontier polygons are then saved. The first shape set is then replaced with the second shape set. The steps of growth of frontier polygons to generate a second shape set; determining frontier polygons; and saving the determined frontier polygons, is continued as long as the process produces at least one frontier polygon or until growth has reached the electrical-distance to be tested for.

In the present embodiment, frontier edges are determined by dropping those portions of the edges of the shapes of the second shape set that overlap the shapes within the first shape set and dropping those portions of the edges of the shapes of the second shape set that extend beyond the boundaries of the shapes on which the electrical distance test is being performed. Similarly, frontier polygons are determined by dropping those portions of the shapes of the second shape set that overlap the shapes within the first shape set and dropping those portions of the shapes of the second shape set that extend beyond the boundaries of the shapes on which the electrical distance test is being performed.

Because the methods of the present invention track only the incremental growth, not the whole region flooded so far as in conventional methods, the present invention is much faster than conventional methods. In addition, the methods of the present invention do not require as much memory as do conventional methods. In addition, as each smaller shape is completely, or fully traversed, no frontier edges or frontier polygons result from subsequent growth steps. This advantageously reduces memory and run-time.

The method and apparatus of the present invention provides for efficiently determining bounded sizing of shapes for verification of a semiconductor device design, yielding shortened verification run-times. In addition, the method and apparatus of the present invention performs an electrical distance check quickly and accurately and is not overwhelmed by the sheer volume and complexity of data that is required to be processed.

These and other objects and advantages of the present invention will no doubt become obvious to those of ordinary skill in the art after having read the following detailed description of the preferred embodiments which are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention.

BEST MODE FOR CARRYING OUT THE INVENTION

Figure 1:
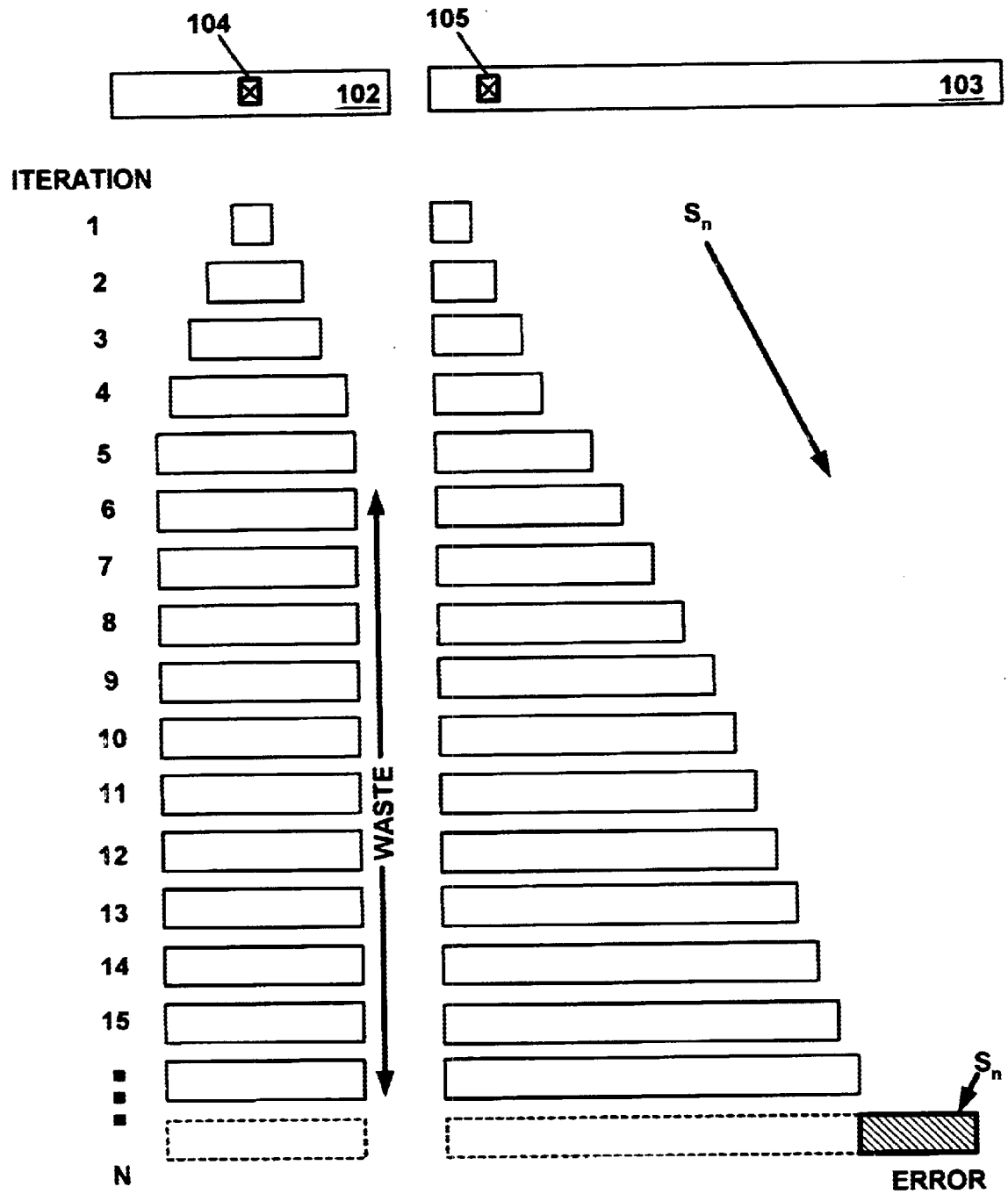
FIG. 1 (Conventional Art) is a schematic diagram of a conventional method for determining electrical distance.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Some portions of the detailed descriptions which follow are presented in terms of procedures, logic blocks, processing, and other symbolic representations of operations on data bits within a computer memory. These descriptions and representations are the means used by those skilled in the data processing arts to most effectively convey the substance of their work to others skilled in the art. In the present application, a procedure, logic block, process, etc., is conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "designating", "incorporating", "calculating", "determining", "communicating" or the like, refer to the actions and processes of a computer system, or similar electronic computing device. The computer system or similar electronic computing device manipulates and transforms data represented as physical (electronic) quantities within the computer system's registers and memories into other data similarly represented as physical quantities within the computer system memories or registers or other such information storage, transmission, or display devices. The present invention is also well suited to the use of other computer systems such as, for example, optical and mechanical computers.

COMPUTER SYSTEM ENVIRONMENT OF THE PRESENT INVENTION

Figure 2:
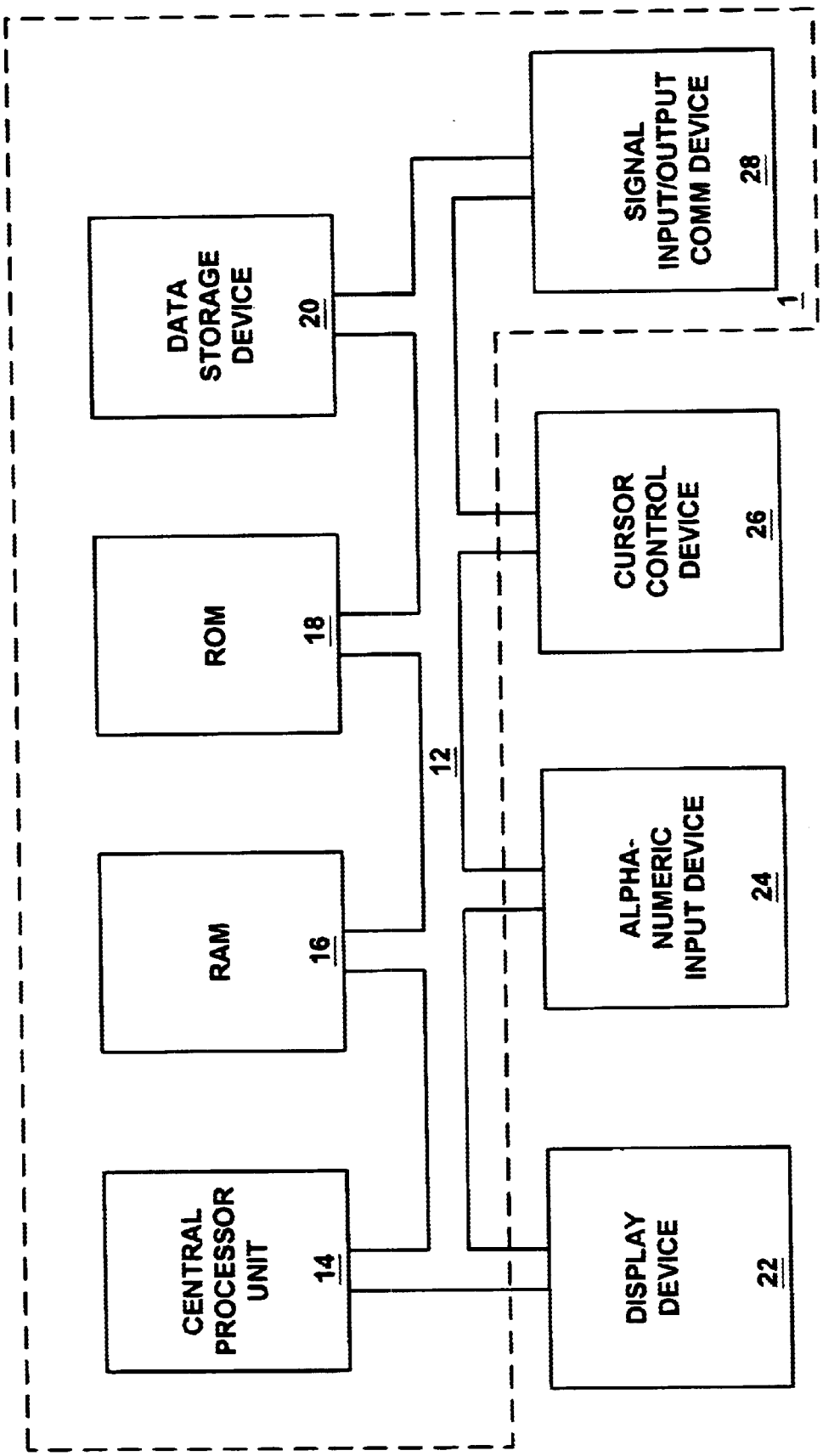
FIG. 2 is a schematic diagram of an exemplary computer system used as a part of the method for performing an electrical distance check in accordance with the present claimed invention.

With reference now to FIG. 2, portions of the method and apparatus for performing an electrical distance check of the present invention are comprised of computer executable instructions which may reside in a computer system. FIG. 2 illustrates an exemplary computer system 1 used for determining electrical distance in accordance with the present invention. It is appreciated that the computer system 1 of FIG. 2 is exemplary only and that the present invention can operate within a number of different computer systems including general purpose computers systems, embedded computer systems, and stand alone computer systems.

Computer system 1 of FIG. 2 includes an address/data bus 12 for communicating information, a central processor unit 14 coupled to bus 12 for processing information and instructions. Computer system 1 also includes data storage features such as a Random Access Memory (RAM) 16 coupled to bus 12 for storing information and instructions for central processor unit 14, a Read Only Memory (ROM) 18 coupled to bus 12 for storing static information and instructions for the central processor unit 14, and a data storage device 20 (e.g., a magnetic or optical disk and disk drive) coupled to bus 12 for storing information and instructions. Computer system 1 of the present embodiment also includes an optional display device 22 coupled to bus 12 for displaying information to a computer operator. An alphanumeric input device 24 including alphanumeric and function keys and an optional cursor control device are shown to be coupled to bus 12 for communicating information and command selections to central processor unit 14.

Display device 22 of FIG. 2, utilized with computer system 1 of the present invention, may be a liquid crystal device, cathode ray tube, or other display device suitable for creating graphic images and alphanumeric characters recognizable to the user. Cursor control device 26 allows the computer user to dynamically signal the two dimensional movement of a visible symbol (cursor) on a display screen of display device 22. Many implementations of cursor control device 26 are known in the art including a trackball, mouse, touch pad, joystick or special keys on alphanumeric input device 24 capable of signaling movement of a given direction or manner of displacement. Alternatively, it will be appreciated that a cursor can be directed and/or activated via input from alphanumeric input device 24 using special keys and key sequence commands. The present invention is also well suited to directing a cursor by other means such as, for example, voice commands. Computer system 1 also includes a signal input output communication device 28 (e.g. a modem) coupled to bus 12 for communicating with other devices and systems.

METHOD FOR PERFORMING ELECTRICAL-DISTANCE CHECKS

Figure 3:
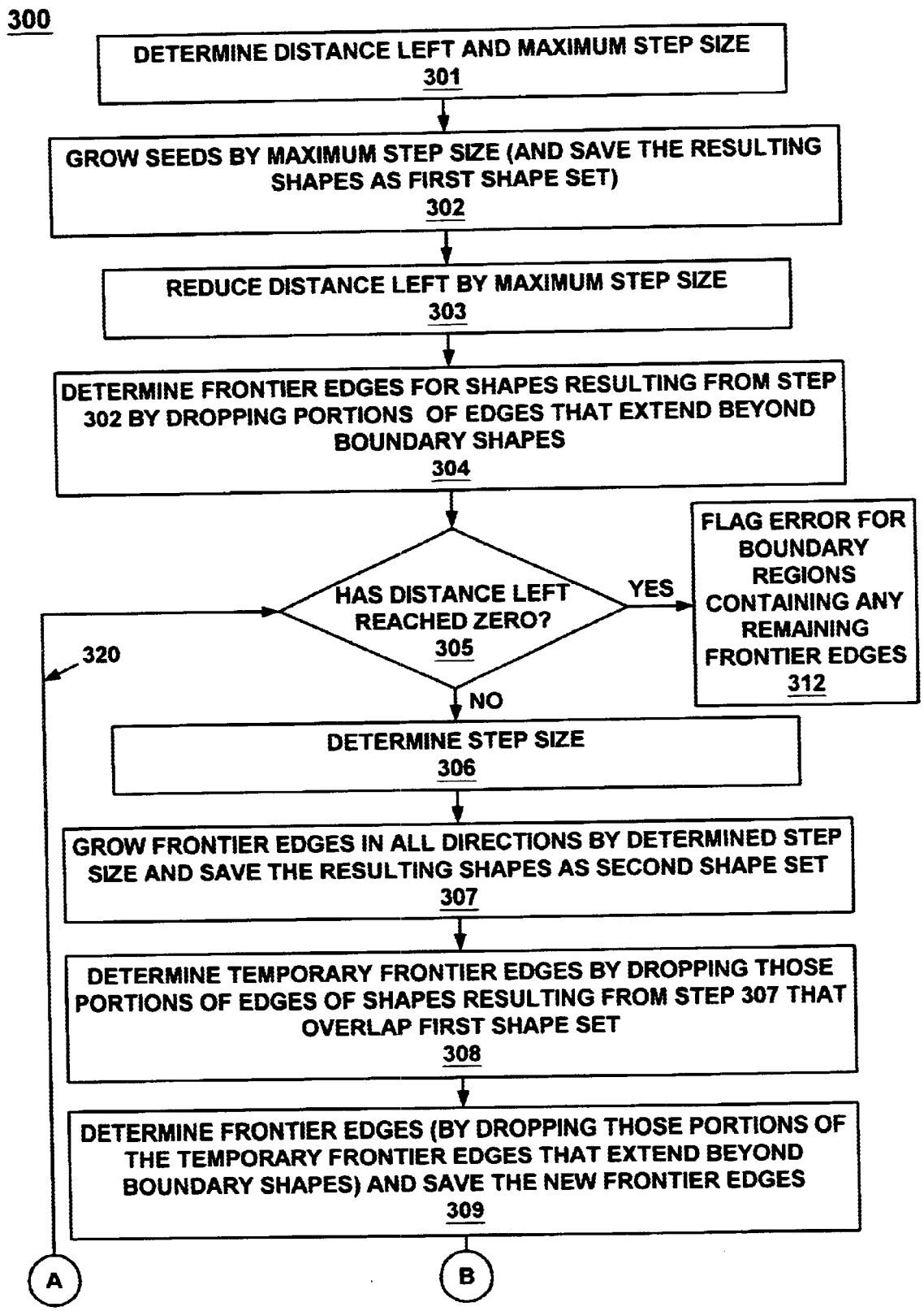
FIG. 3 is a flow chart of a method for performing an electrical distance check in accordance with one embodiment of the present claimed invention.
Figure 3:
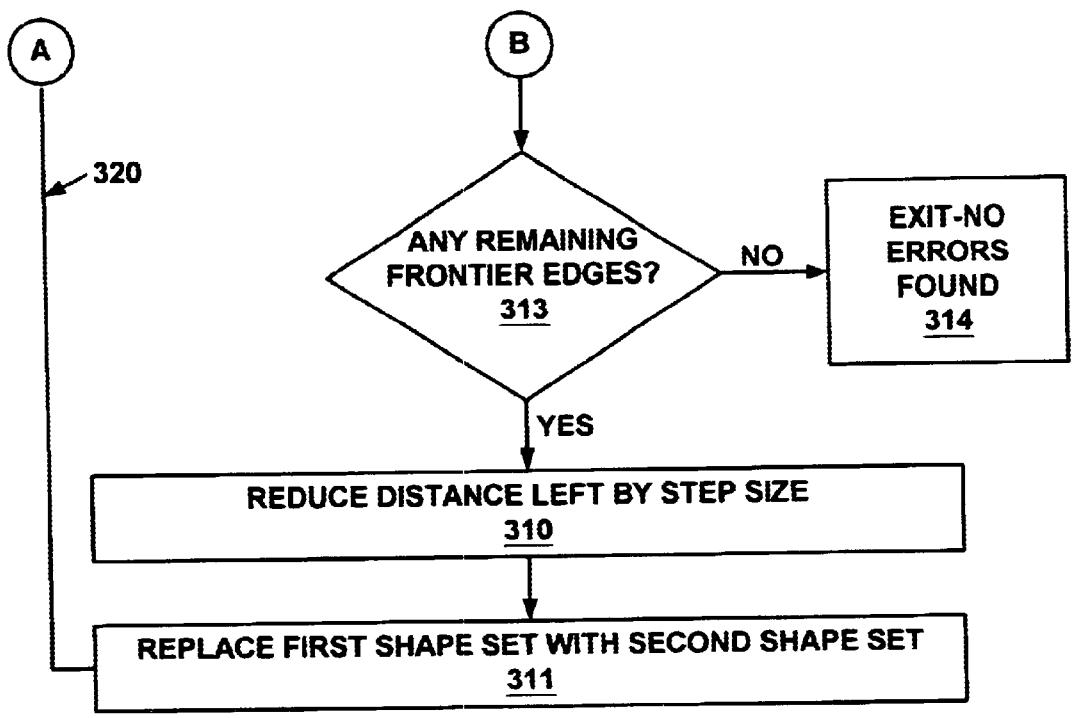

FIG. 3 shows a method 300 for performing electrical distance checks that includes steps 301–314. First, as shown by step 301, a distance left and a maximum step size are determined. In one embodiment of the present invention, the distance left and the maximum step size are user-determined and are received as input. In the embodiment shown in FIG. 2, input device 24 is used to couple user input of distance left and maximum step size into computer 1.

In the present embodiment, the distance left is initially established to be the maximum amount of distance allowed in the electrical distance test. The distance left, sometimes referred to as the maximum distance, is manually input into the computer or a preset default maximum distance is used.

As shown by step 302 seeds are grown by the maximum step size. The resulting shapes are saved as a first shape set. The growth can be internal or external to a particular boundary shape set. In one embodiment, the following Boolean layer operations language is used to define step 302: NoBackTrackA=SIZE (Seeds, max_step).

Figure 4A:
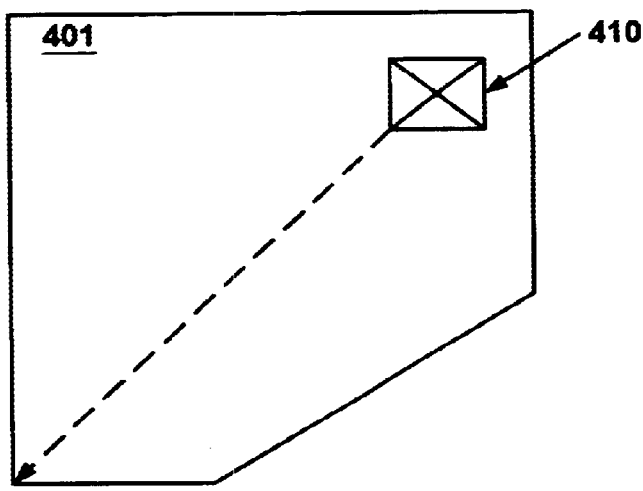
FIG. 4A is a logical representation of an exemplary seed that is disposed within an exemplary shape in accordance with one embodiment of the present claimed invention.
Figure 4B:
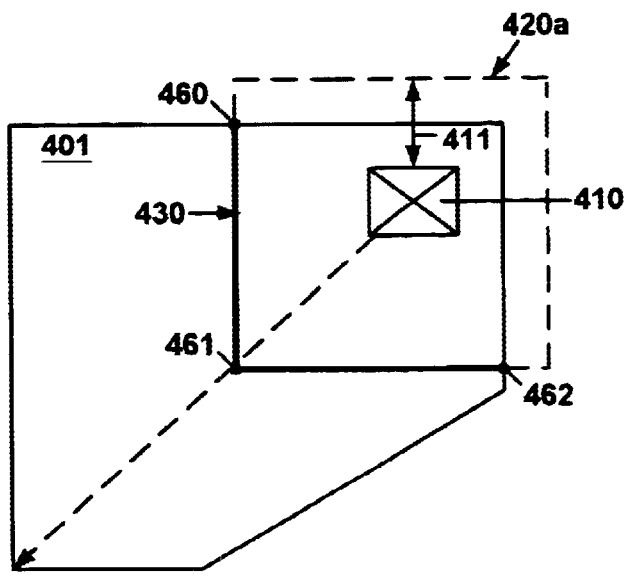
FIG. 4B is a logical representation of an exemplary first growth step within the shape shown in FIG. 4A in accordance with one embodiment of the present claimed invention.

FIG. 4A shows exemplary seed 410 that is within boundary shape 401. Growth step 302 of FIG. 3 is shown to form shape 420a of FIG. 4B which is saved as one of the shapes of the first shape set. It can be seen that shape 420a results from the growth of seed 410 equally in all directions by the maximum step size which is illustrated by arrow 411.

In the present embodiment, conventional methods for determining step size are used to determine an appropriate maximum step size. It is appreciated that various methods for determining step size are known, and that an appropriate step size is determined such that the desired growth (either inside a shape or outside a shape set) does not unnecessarily consume computing resources (when step size is too small) or grows fully across the region beyond a boundary shape edge into the neighboring boundary shape(when size is too large). In one embodiment, a first approximation in the process of selecting the per-step grow-value for a size-inside operation uses the minimum legal spacing of barrier shapes while for a size-outside operation the minimum legal width of barrier shapes is used. A second approximation may then be determined that takes into account the square root extra growth of the corners which is followed by a third approximation in which one or more grid value is subtracted from the second approximation.

The distance left is initially set at the maximum distance to be tested for in the electrical distance check. Now referring to step 303, the distance left is reduced by the maximum step size. In one embodiment, step 303 is defined by the following arithmetic statement: left=left −max_step.

As shown by step 304, frontier edges are determined for each shape resulting from step 302. In the present embodiment the frontier edges are defined by two or more coordinates that represent that portion of the outer edges of the shapes resulting from step 302 that remain after predetermined criteria are applied to the outer edges of the shapes resulting from step 302. In the present embodiment, frontier edges are determined by dropping off that portion of the shapes resulting from step 302 that lie outside of the boundary shape set. In the present embodiment, a Cartesian coordinate system is used to define the frontier edges. Alternatively, any of a number of other methods could be used to define the frontier edges. In the embodiment shown in FIG. 4B frontier edges 430, is saved in the form of Cartesian coordinates that define points 460–462.

When the distance left reaches zero, as shown by steps 305 and 312 an error is flagged-for boundary regions containing any remaining frontier edges.

Figure 4C:
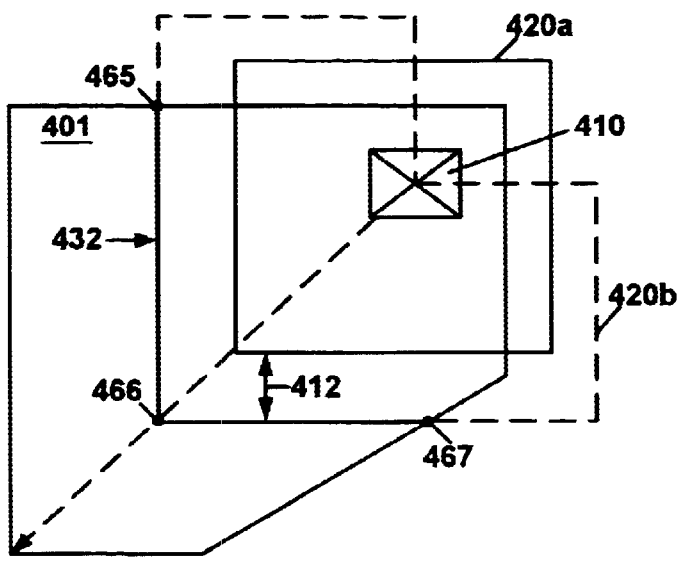
FIG. 4C is a logical representation of an exemplary second growth step within the shape shown in FIG. 4A in accordance with one embodiment of the present claimed invention.

If the distance left has not reached zero, step size is determined as shown by steps 305–306. In the present embodiment, step size is determined to be the smaller of distance left and maximum step size. However, alternatively, step size could be determined using other methods. In the embodiment shown in FIG. 4C the distance left exceeds the maximum step size. Therefore, the step size, illustrated by the length of arrow 412 is equal to the maximum step size. In one embodiment, the following arithmetic statement is used to define step 306: this_step=min(max_step, left).

Referring now to step 307, each frontier edge is incrementally grown by the step size determined in step 306 and the results are saved as a second shape set. In the present embodiment, each frontier edge is grown by the determined step size in all directions to determine a corresponding set of shapes that are saved as a second shape set. In the embodiment shown in FIG. 4C, growth step 307 forms shape 420b which is saved as one of the shapes in the second shape set. In one embodiment, the following boolean layer operations language is used to define step 307: NoBackTrackB=SIZE (Frontier, this_step).

Referring now to steps 308–309, frontier edges are determined. In the present embodiment, frontier edges are determined by performing a set of predetermined operations on the second shape set such that no frontier edges are determined for boundary shapes that have been fully traversed.

More particularly, temporary frontier edges are first determined as shown by step 308. In the present embodiment temporary frontier edges are determined by dropping those portions of the edges of the shapes resulting from step 307 that overlap the first shape set. Thus, in the embodiment shown in FIG. 4C, temporary frontier edges are determined by dropping those portions of the edges of shape 420b that overlap shape 420a (illustrated with a short-dashed line).

Referring now to Step 309, new frontier edges are then determined by dropping those portions of the temporary frontier edges that extend beyond the boundary shape set (illustrated using a long-dashed line). The remaining portion of the edges of shape 420b, form frontier edge 432. In the present embodiment, frontier edge 432 is saved in the form of Cartesian coordinates that define points 465–467.

Referring now to steps 313–314, when there are no remaining frontier edges, the program ends. In the present embodiment, when the program ends, a message is generated that no errors are found.

As shown by steps 313 and 310, if there are remaining frontier edges, the distance left is reduced by the step size determined in step 306. In the embodiment shown in FIGS.

4A–4C, there is a remaining frontier edge (frontier edge 432). Therefore, a new distance left is determined by subtracting the step size illustrated by arrow 412 from the distance left determined in step 303. In one embodiment, the following arithmetic pseudo-code is used to define step 310: left=left−this_step.

The first shape set is then replaced with the second shape set as shown by step 311. Thus, in the embodiment shown in FIGS. 4A–4C, shape 420b replaces shape 420a of the first shape set. This gives a saved shape in the first shape set of 420b. In one embodiment, the following Boolean layer operations language is used to define step 311: NoBackTrackA=NoBackTrackB.

Next, as shown by arrow 320 and steps 305–311 and 313, the growth process continues until the distance left reaches zero or until no frontier edges remain.

Figure 4D:
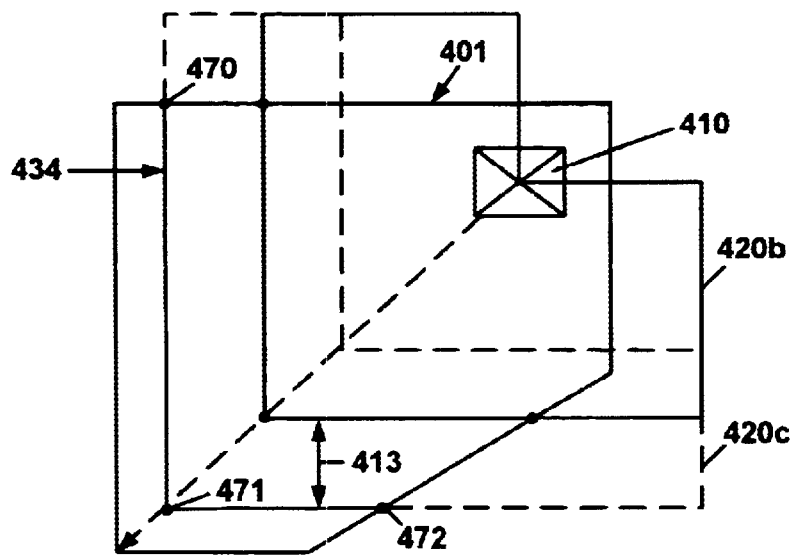
FIG. 4D is a logical representation of an exemplary third growth step within the shape shown in FIG. 4A in accordance with one embodiment of the present claimed invention.

Referring now to FIG. 4D, because distance left has not reached zero (step 305) step size is determined (step 306). Step size is again determined to be the maximum step size because the distance left exceeds the maximum step size. Therefore, the step size, illustrated by the length of arrow 413 is equal to the maximum step size.

The growth of step 307 results in shape 420c which is saved as one of the shapes of the second shape set. In the present embodiment, this new determination of a second shape set is saved and the previous second shape set is deleted. In the present embodiment, the previously saved second shape set is overwritten by the new second shape set. Thus, in the embodiment shown in FIGS. 4A–4D, shape 420b is overwritten by shape 420c.

The temporary frontier edges determined in step 308 include those portions of shape 420c that do not overlap shape 420b. Step 309 then determines new frontier edges 434 which represent the remainder of shape 420c after that portion of shape 420c that extends beyond the boundary shape 401 is dropped.

Because there is still a frontier edge (frontier edge 434), the distance left is reduced by the step size as shown by steps 310 and 313. The first shape set is then replaced with the second shape set as shown by step 311. More particularly, in the embodiment shown in FIGS. 4A–4D, shape 420b will be replaced with shape 420c, giving a first shape set that includes shape 420c.

The process is then repeated as shown by step 4E. That is, because distance left has not reached zero (step 305) step size is determined (step 306). Step size is again determined to be the maximum step size because the distance left exceeds the maximum step size. Therefore, the step size, illustrated by the length of arrow 414 is equal to the maximum step size.

The growth of step 307 results in shape 420d which is saved as one of the shapes of the second shape set. In the present embodiment, this new determination of a second shape set is saved while the previous shape in the second shape set (shape 420c) is overwritten.

Figure 4E:
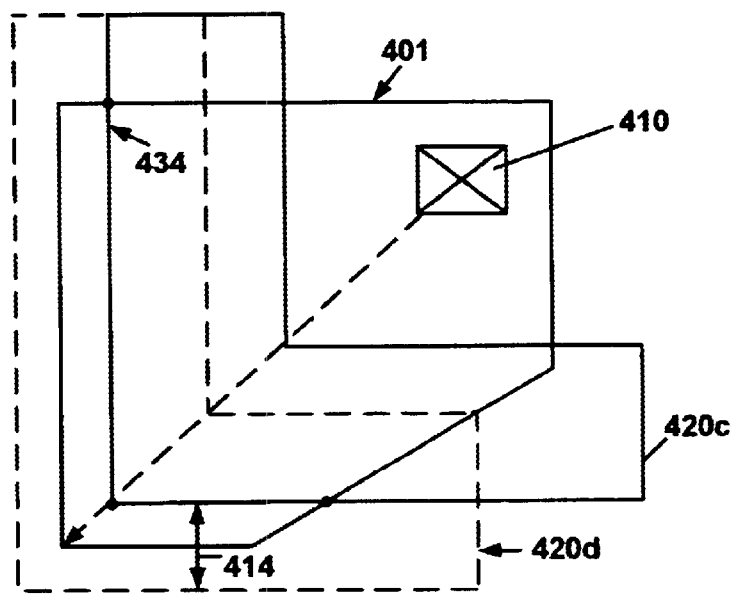
FIG. 4E is a logical representation of an exemplary fourth growth step within the shape shown in FIG. 4A in accordance with one embodiment of the present claimed invention.

The temporary frontier edges determined in step 308 include those portions of shape 420d that do not overlap shape 420c (shown in long-dashed line in FIG. 4E). In step 309, because all of the temporary frontier edges extend outside of shape 401, no frontier edges will be determined. Therefore, (assuming that shape 410 is the only shape or the only remaining shape) there will not be any remaining frontier edges, causing the program to exit the loop of steps 305–311 and 313 as shown by steps 313–314.

Figure 5:
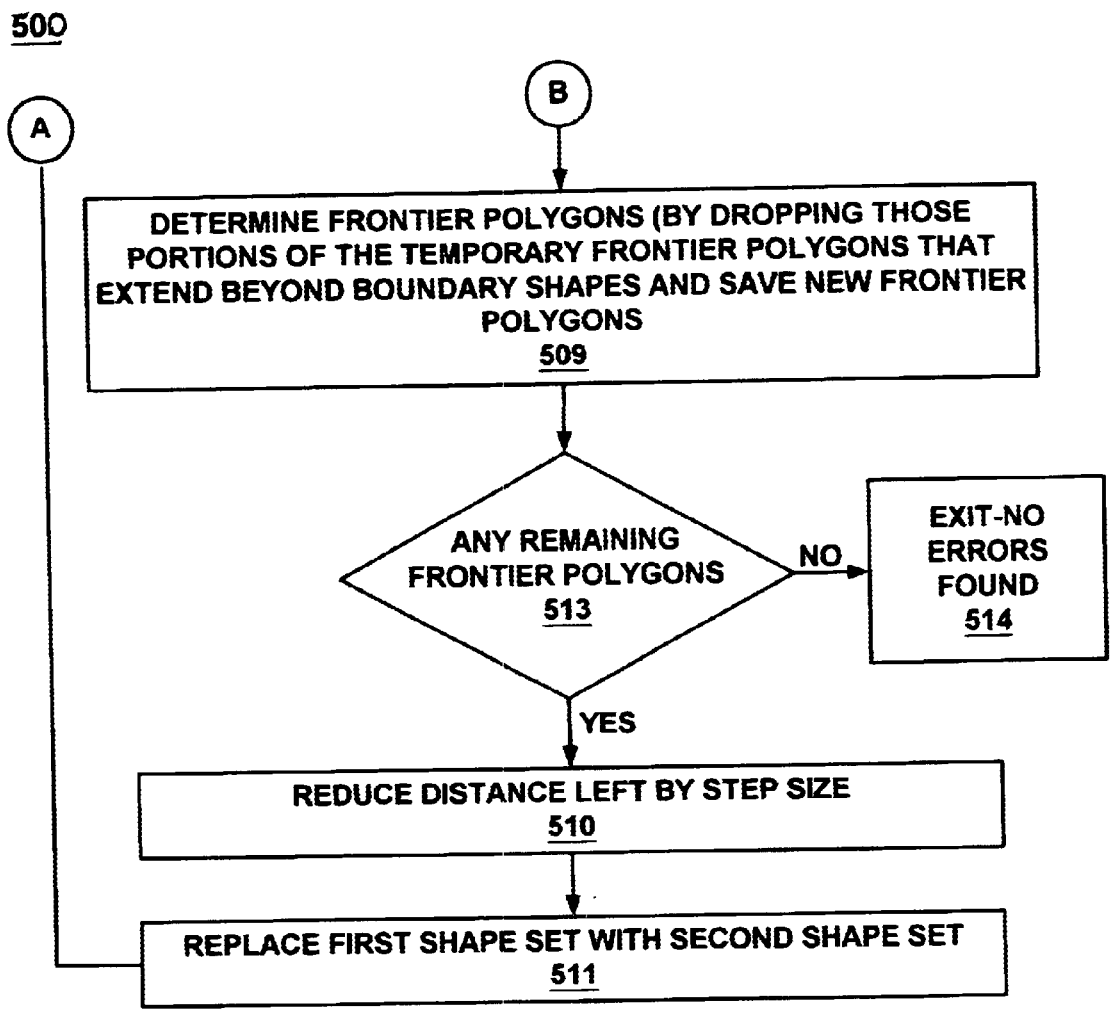
FIG. 5 is a flow chart of a method for performing an electrical distance check in accordance with one embodiment of the present claimed invention.
Figure 6A:
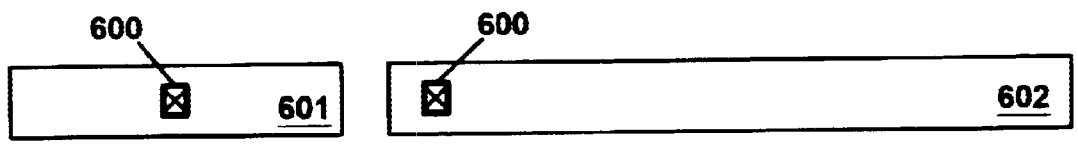
FIG. 6A is a logical representation of exemplary seeds within exemplary shapes that illustrates the method for performing an electrical distance check of FIG. 5 in accordance with one embodiment of the present claimed invention.
Figure 6B:
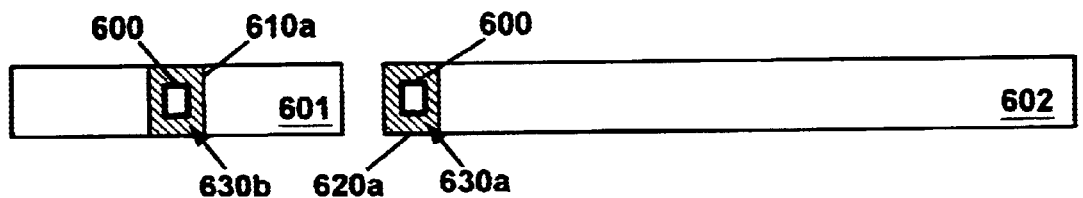
FIG. 6B is a logical representation of a first growth step within the shapes shown in FIG. 6A, that illustrates the method for performing an electrical distance check of FIG. 5 in accordance with one embodiment of the present claimed invention.
Figure 6C:
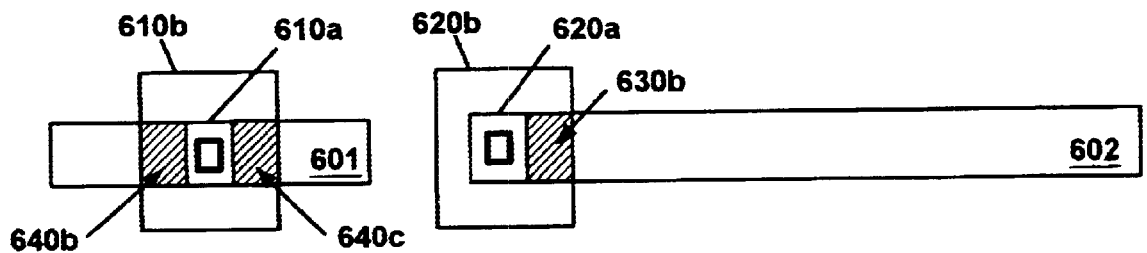
FIG. 6C is a logical representation of a second growth step within the shapes shown in FIG. 6A, that illustrates the method for performing an electrical distance check of FIG. 5 in accordance with one embodiment of the present claimed invention.
Figure 6D:
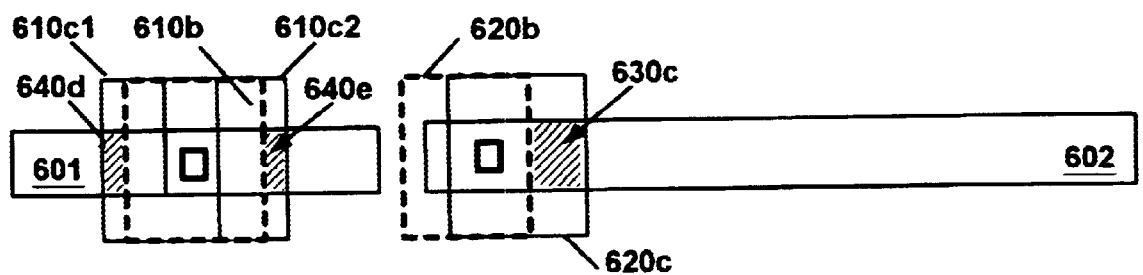
FIG. 6D is a logical representation of a third growth step within the shapes shown in FIG. 6A, that illustrates the method for performing an electrical distance check of FIG. 5 in accordance with one embodiment of the present claimed invention.
Figure 6E:
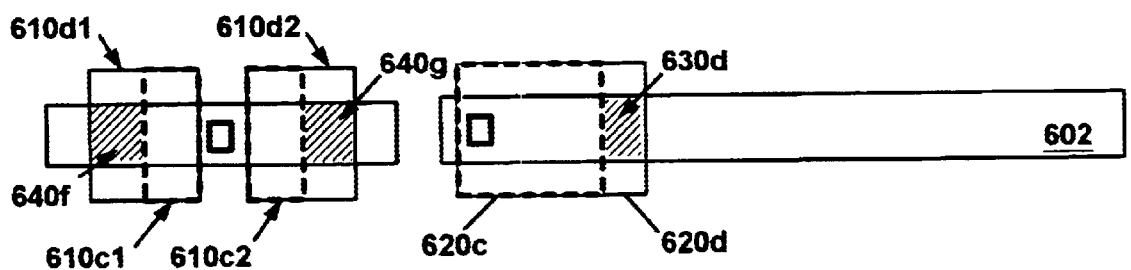
FIG. 6E is a logical representation of a fourth growth step within the shapes shown in FIG. 6A, that illustrates the method for performing an electrical distance check of FIG. 5 in accordance with one embodiment of the present claimed invention.
Figure 6F:
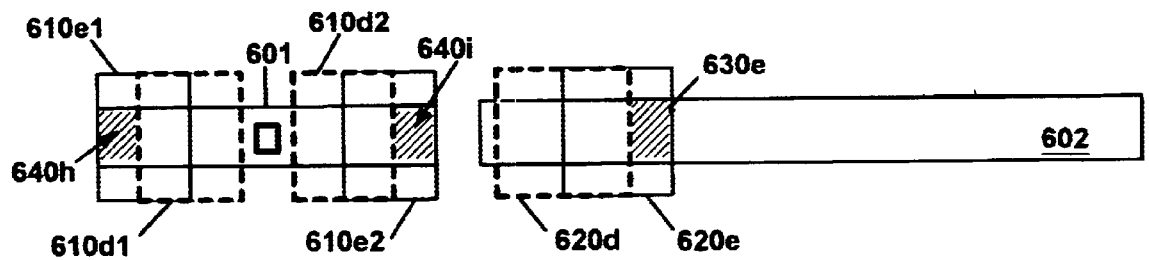
FIG. 6F is a logical representation of a fifth growth step within the shapes shown in FIG. 6A, that illustrates the method for performing an electrical distance check of FIG. 5 in accordance with one embodiment of the present claimed invention.
Figure 6G:
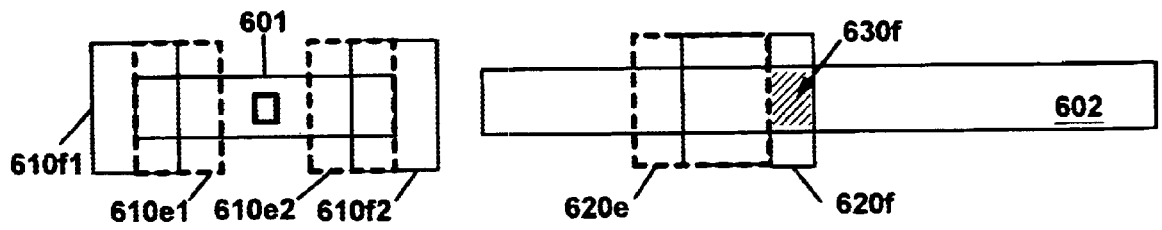
FIG. 6G is a logical representation of a sixth growth step within the shapes shown in FIG. 6A, that illustrates the method for performing an electrical distance check of FIG. 5 in accordance with one embodiment of the present claimed invention.
Figure 6H:
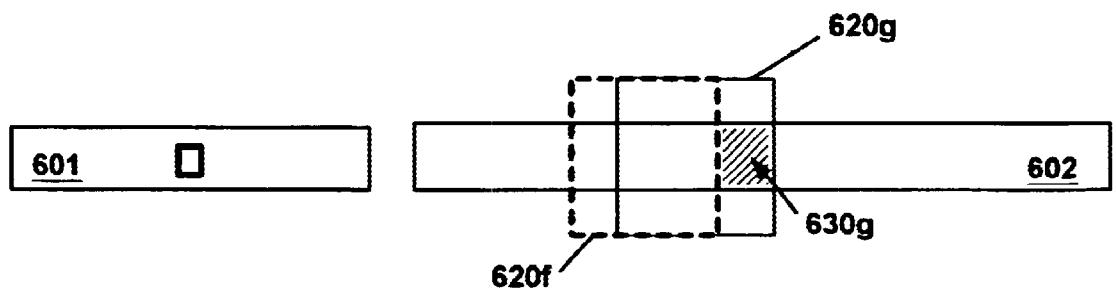
FIG. 6H is a logical representation of a seventh growth step within the shapes shown in FIG. 6A, that illustrates the method for performing an electrical distance check of FIG. 5 in accordance with one embodiment of the present claimed invention.
Figure 7:
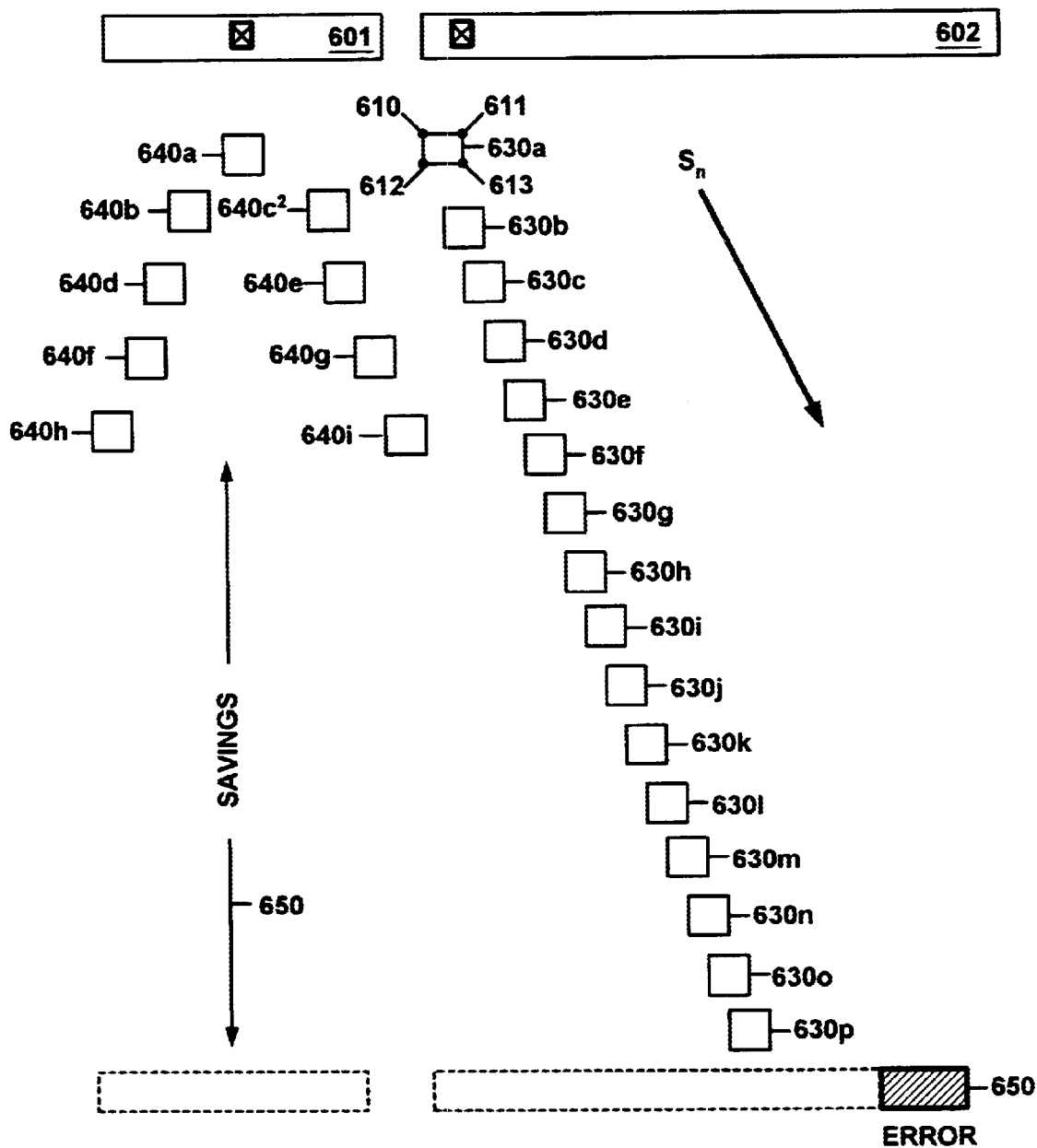
FIG. 7 is a logical representation that illustrates the growth shown in steps 6A–6H and continued growth within the shapes shown in FIG. 6A that illustrates the method for performing an electrical distance check of FIG. 5 in accordance with one embodiment of the present claimed invention.

FIGS. 5–7 show an embodiment of the present invention in which frontier polygons are determined. More particularly, instead of determining frontier edges, method 500 of FIG. 5 determines frontier polygons (steps 504, 508 and 509) after each growth step.

In one embodiment, step 504 determines frontier polygons by dropping off those portions of the shapes resulting from step 502 that extend beyond the boundary shape set. The following Boolean layer operations language is used to define step 502: NoBackTrackA=SIZE (Seeds, max_step). Frontier polygons are determined in steps 508–509 by dropping those portions of the shapes of the second shape set that overlap the first shape set (step 508) and dropping those portions of the shapes of the second shape set that extend beyond the boundary shape set (step 509). In one embodiment, the following Boolean layer operations language is used to define step 508: Tmp=ANDNOT (NoBackTrackB, NoBackTrackA) and the following Boolean layer operations language is used to define step 509: Seeds=AND(Tmp, Boundary).

Continuing with FIG. 5, the process of growth continues (steps 505–511 and 513) until the distance left reaches zero (an error is then flagged for frontier polygons that have not reached boundary edges as shown by steps 505 and 512), or until there are no remaining frontier polygons (the program then exits with no errors found as shown by steps 513 and 514). In one embodiment, growth step 507 is defined by the following Boolean layer operations language: NoBackTrackB=SIZE(Seeds, this_step).

Referring now to FIGS. 6A–6H and FIG. 7, method 500 of FIG. 5 is illustrated for shapes 601–602. Seeds 600 of FIG. 6A are grown (step 502) by the maximum step size to produce a first shape set including shapes 610a and 620a. The next growth (step 507 of FIG. 5) produces a second shape set that includes shapes 610b and 620b shown in FIG. 6C. Frontier polygons 640b, 640c and 630b are formed by dropping those portions of the shapes grown in the previous growth step that extend beyond the boundary shapes 601 and 602 (step 509). In one embodiment, the following Boolean layer operations language is used to define step 504: Seeds= AND (NoBackTrackA, Boundary).

The next growth (step 507 of FIG. 5) produces a second shape set that includes shapes 610c1, 610c2 and 620c. In the present embodiment, growth is not allowed to extend over any adjoining boundary shape. Thus, in the embodiment shown in FIG. 6D, growth of shape 630b is limited such that shape 620c does not extend over the boundary of shape 601.

Continuing with FIG. 6D, frontier polygons 640d, 640e and 630c are formed by dropping those portions of the shapes grown in the previous growth step that overlap the first shape set (step 508) and dropping those portions of the shapes grown in the previous growth step that extend beyond the boundary shape set (step 509). This growth process continues as shown in steps 6E and 6F to produce shape sets that include shapes 610d1–610e2 and 620d–620e and to produce frontier polygons 640f–640i and 630d–630e.

Referring now to FIG. 6G, the next growth step produces shapes 610f1, 610f2 and 620f. In the present embodiment, when those portions of the second shape set that overlap the first shape set are dropped (step 508) no frontier polygons remain that interact with boundary shape 601, while frontier polygon 630f is a remaining frontier polygon and shape 602 has not yet been fully traversed.

Referring now to FIG. 6H, the next growth step produces a shape set that includes shape 620g. Frontier polygon 630g is formed by dropping those portions of the shapes grown in the previous growth step that overlap the first shape set (step 508) and dropping those portions of the shapes grown in the previous growth step that extend beyond the boundary shape set (step 509).

In the present embodiment, growth continues, producing frontier polygons 630h–630p shown in FIG. 7. However, these subsequent growth steps do not produce any frontier polygons corresponding to shape 601. In the present embodiment, at the growth step that produces frontier polygon 630p, distance left reaches zero (step 505). This results in an error being flagged for shape 602. In the present embodiment, the error flag indicates the area that has yet to be traversed of each shape that includes a frontier polygon. In the present embodiment, the error flag Indicates region 650 that represents the area that has not been traversed within shape 602.

Referring now to FIG. 7, arrow 651 illustrates the savings resulting from the discontinued growth of frontier polygons for shape 601 once growth has fully traversed the boundaries of shape 601. Thus, significant savings result as compared to the prior art process shown in conventional art FIG. 1.

In the present embodiment, frontier polygons are represented by the points that make up each of the corners of the polygon that are indicated as Cartesian coordinates. For example, in the embodiment shown in FIG. 7, the Cartesian coordinates representing points 610–613 are stored to represent frontier polygon 630a. Similarly, Cartesian coordinates that represent each of the corners of frontier polygons 640a–640i and 630b–630p are stored to represent frontier polygons 640a–640i and 630b–630p.

Figure 8A:
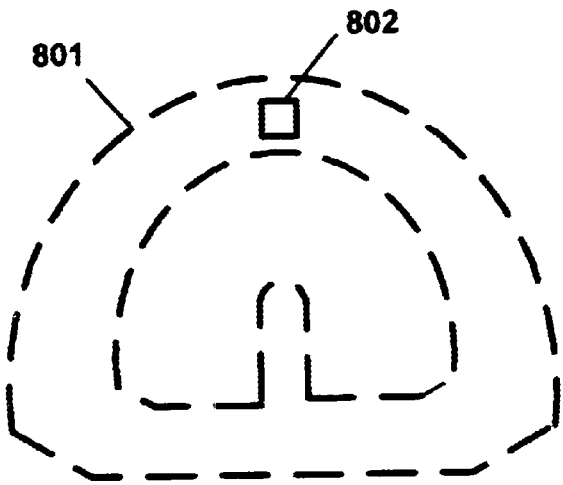
FIG. 8A is a logical representation that illustrates an exemplary seed that is disposed within a complex shape in accordance with one embodiment of the present invention.
Figure 8B:
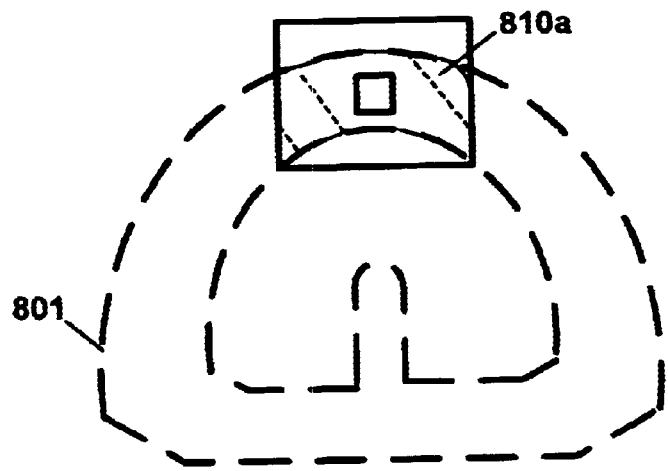
FIG. 8B is a logical representation that illustrates an exemplary first growth step of a seed within a complex shape in accordance with one embodiment of the present invention.
Figure 8C:
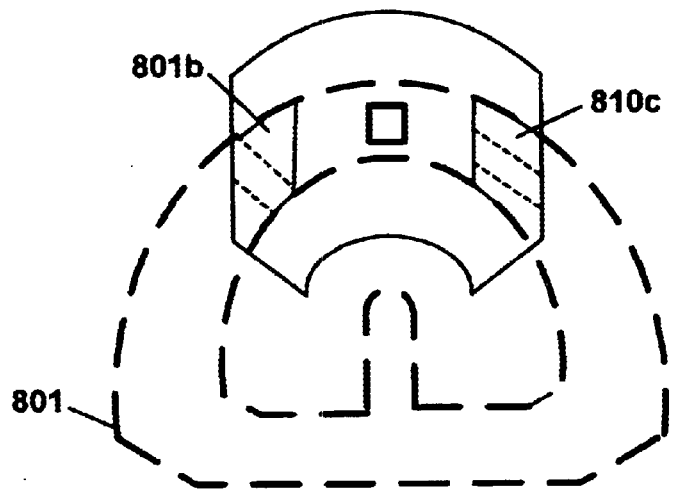
FIG. 8C is a logical representation that illustrates an exemplary second growth step of a seed within a complex shape in accordance with one embodiment of the present invention.
Figure 8D:
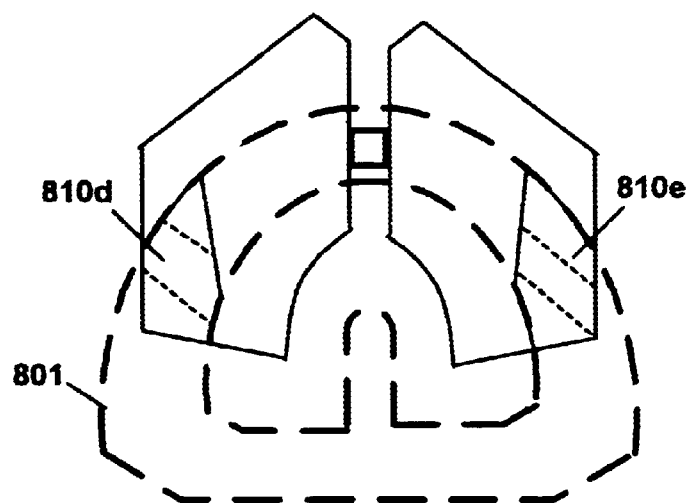
FIG. 8D is a logical representation that illustrates an exemplary third growth step of a seed within a complex shape in accordance with one embodiment of the present invention.
Figure 8E:
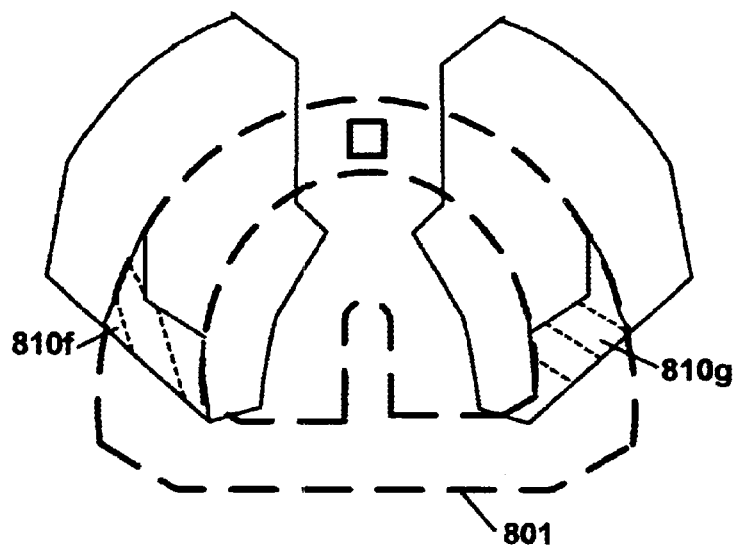
FIG. 8E is a logical representation that illustrates an exemplary fourth growth step of a seed within a complex shape in accordance with one embodiment of the present invention.
Figure 8F:
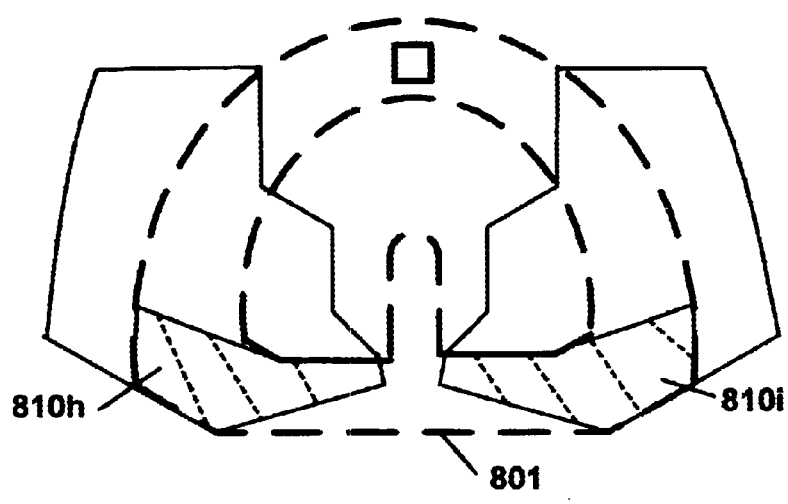
FIG. 8F is a logical representation that illustrates an exemplary fifth growth step of a seed within a complex shape in accordance with one embodiment of the present invention.
Figure 8G:
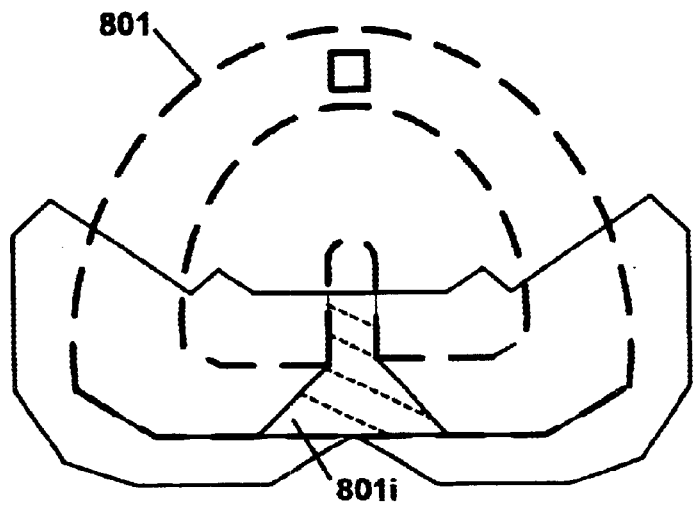
FIG. 8G is a logical representation that illustrates an exemplary sixth growth step of a seed within a complex shape in accordance with one embodiment of the present invention.
Figure 8H:
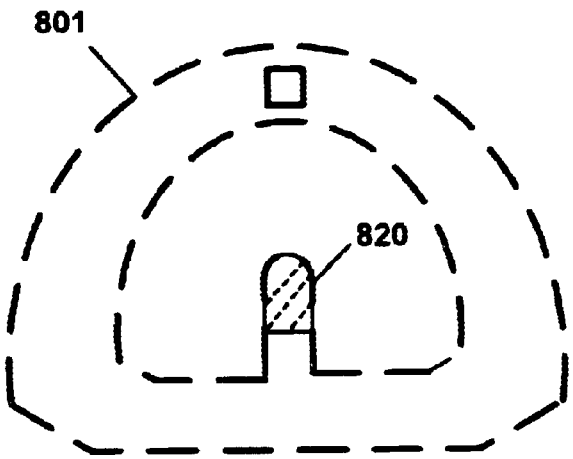
FIG. 8H is a logical representation that illustrates an exemplary result from growth of a seed within a complex shape in accordance with one embodiment of the present invention.

FIGS. 8A–8H show growth within a complex shape 801 according to method 500 of FIG. 5 that produces frontier polygons 810a–810j. More particularly, the first growth step from seed 802 of FIG. 8A produces frontier polygon 810a (FIG. 8B). The following growth step, illustrated in FIG. 8C, produces frontier polygons 810b–810c. Growth continues, producing frontier polygons 810d–810j of FIGS. 8D–8G until the distance left reaches zero (step 505 of FIG. 5). This results in an error flag for those shapes that have not been fully traversed (step 512). In the present embodiment, an error is flagged that indicates the area yet to be traversed within the shape as shown by error indicator 820 of FIG. 8H.

In the embodiments of FIGS. 3 and 5, step size is determined (steps 306 and 506) to be the smaller of the distance left and the maximum step size. Therefore, the step size in the last step prior to reaching a target distance will be the distance left.

The methods of the present invention are adapted to determine any of a number of relevant indications of electrical-distance. In one embodiment of the present invention, method 300 of FIG. 3 or method 500 of FIG. 5 is used to compute edge boundaries. In another embodiment of the present invention, method 300 of FIG. 3 or method 500 of FIG. 5 is used to compute beyond regions. In yet another embodiment, method 300 of FIG. 3 or method 500 of FIG. 5 is used in the computation of between regions.

Figure 9A:
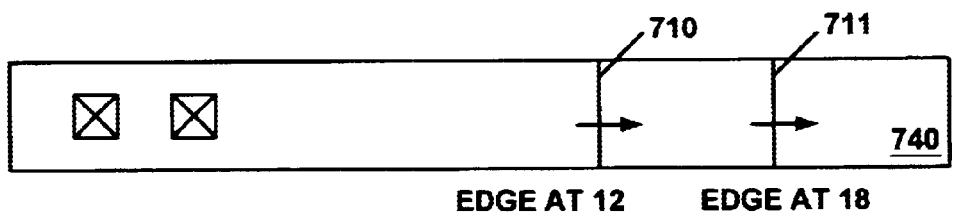
FIG. 9A is a logical representation that illustrates an exemplary computation of edge boundaries in accordance with one embodiment of the present claimed invention.

FIG. 9A shows an exemplary shape 700 and an exemplary computation of edge boundaries. In this embodiment, an edge boundary 710 of 12 microns and edge boundary 711 of 18 microns are determined. In the present embodiment, determination of edge boundary is performed by growth from the last full growth step. That is, for example, when a maximum step size of 1.1 is used, the growth from 0 to 12 is accomplished as 10 growth steps of 1.1 each (reaching 11 so far), followed by a less-than-full step (a growth by 1.0) to reach the first distance target of 12. Similarly, a second growth is performed, starting with the last full growth step (to 11) that grows to the distance target of 18. This eliminates the unnecessary recalculation of the full growth steps (to 11) in the calculation of edge boundary 711 (18 microns).

Figure 9B:
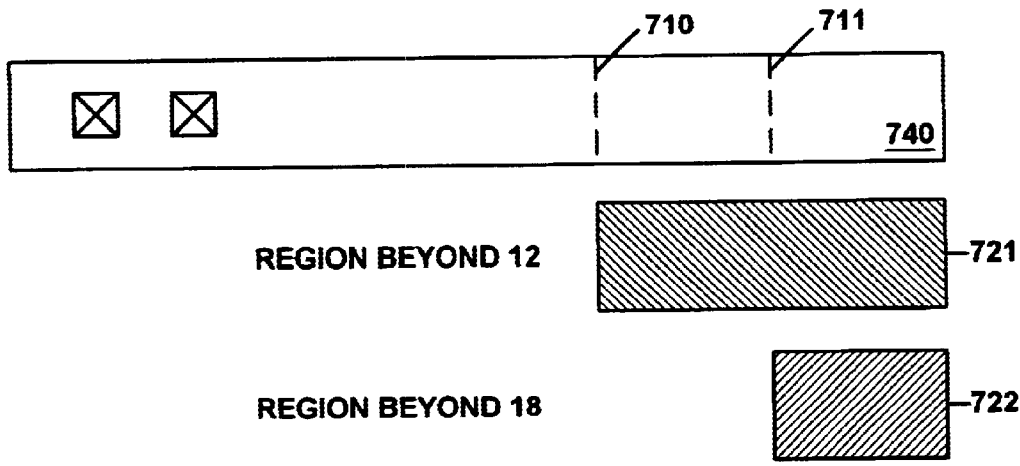
FIG. 9B is a logical representation that illustrates an exemplary computation of beyond regions in accordance with one embodiment of the present claimed invention.

FIG. 9B shows an exemplary shape 700 and an exemplary computation of beyond regions. In this embodiment, a beyond region 721 of 12 microns is calculated and a second beyond region 722 of 18 microns are determined. In the present embodiment, once the desired distance is reached, shown as exemplary distances 710 and 711, a calculation may be performed to determine the regions to the end of the polygon. In one embodiment of the present invention, method 300 of FIG. 3 or method 500 of FIG. 5 is used to determine beyond regions 721–722 by isolating the region beyond edge boundary 710 to determine beyond region 721 and by isolating the region beyond edge boundary 711 to determine beyond region 722. In the present embodiment, growth from the initial edge boundary 710 towards the end of shape 701, shown as end surface 740, is done starting from the last full growth step in the calculation of edge boundary 710 and subsequent growth until end surface 740 is reached or the next distance target is reached. This eliminates the unnecessary recalculation of the full growth steps used in the 12 micron edge boundary 710 in the calculation of beyond region 721. Similarly, growth from edge boundary 711 towards end surface 740 is done using the initially calculated edge boundary 711 of 18 microns and subsequent growth until end surface 740 is reached. This eliminates the unnecessary recalculation of the full growth steps in the calculation of beyond regions 721 and 722.

Figure 9C:
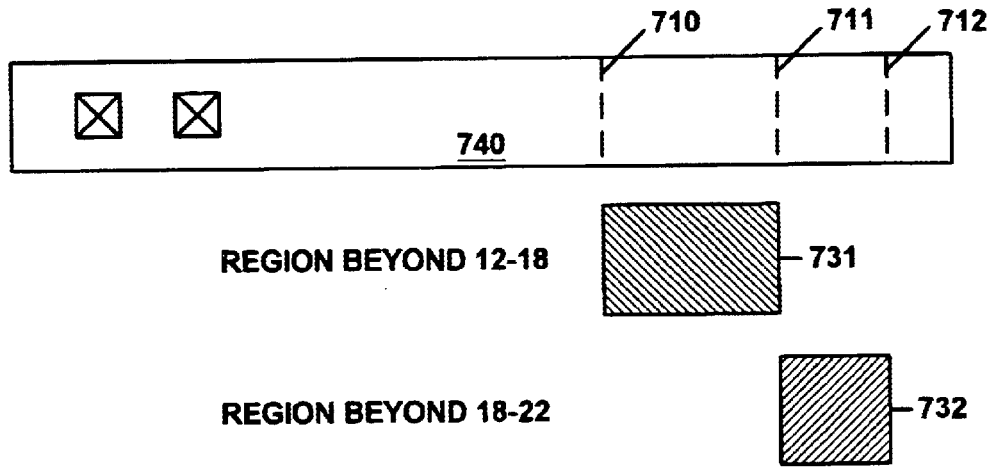
FIG. 9C is a logical representation that illustrates an exemplary computation of between regions in accordance with one embodiment of the present claimed invention.

FIG. 9C shows an exemplary shape 700 and an exemplary computation of between regions. In this embodiment, an edge boundary 710 of 12 microns, edge boundary 711 of 18 microns and edge boundary 712 of 22 microns are shown. In one embodiment of the present invention, method 300 of FIG. 3 or method 500 of FIG. 5 is used to determine between regions 731–732 by first growing to edge boundary 710 and growing, from the last full growth step, to edge boundary 711. Similarly, the calculation of between region 732 starts with the last full growth step in reaching edge boundary 711 and continues to edge boundary 712. This eliminates the unnecessary recalculation of the full growth steps in the calculation of between regions 731 and 732.

Figure 10:
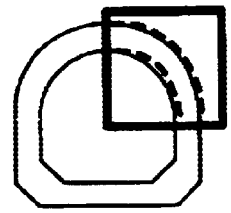
FIG. 10 is a logical representation that illustrates Boolean operations in accordance with one embodiment of the present invention.
Figure 10:
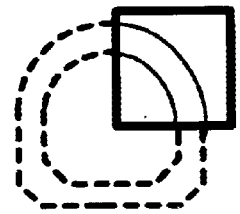
Figure 10:
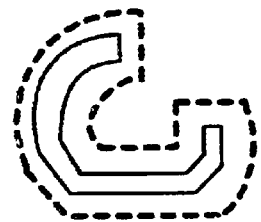

In one embodiment, the present invention is implemented using the following pseudo code:

assign I the set of shapes produced by SIZE-ing set S by g.
assign S the set of shapes produced by set I AND set B.
assign i the value g.
Loop start:
   if i equals or exceeds t go to Loop end (loop exit condition)
   assign h the minimum of either g or (t-i).
   assign J the set of shapes produced by SIZE-ing set S by h.
   assign K the set of shapes produced by set J ANDNOT set I.
   assign S the set of shapes produced by set K AND set B.
   assign I the set J.
   assign i the value of i plus h.
go to Loop start (iterate)
Loop end In the above pseudo-code, capital single letter variable names indicate layer sets, lowercase single letter variable names indicate a single numeric quantity. In the above pseudo code, input includes: layer B (the set of boundary shapes to grow within); layer S (the set of starting seed shapes from which to initiate growth); the real number t (the total electrical-distance to be reached); and the real number g(the maximum step size). Referring now to FIG. 10, the examples of Boolean operations of AND, ANDNOT and SIZE are given.

In one embodiment of the present invention methods 300 and 500 (FIGS. 3 and 5) for checking electrical distance are performed using a general purpose computer such as computer 1 of FIG. 2. In an alternate embodiment, methods 300 and 500 for checking electrical distance are performed using computer useable medium such as a floppy disk or a computer disk (CD) or a removable tape storage device as a software program.

Though the examples given in FIGS. 4A–4E, 6A–8H show the performance of an electrical distance check within a shape, the present invention is also well adapted to determining an electrical distance check without or outside of a shape set. In performing an electrical distance check outside of a shape set, according to the embodiment shown in FIG. 3, frontier edges are determined in step 304 by dropping those portions of the results from step 302 that overlap the boundary shape set. Frontier edges are determined in step 309 by dropping those portions of the results from step 308 that overlap the boundary shape set. In performing an electrical distance check outside of a shape set, according to the embodiment shown in FIG. 5, frontier polygons are determined in step 504 by dropping those portions of the results from step 502 that overlap the boundary shape set. Frontier polygons are determined in step 509 by dropping those portions of the results from step 508 that overlap the boundary shape set.

It is appreciated that the methods of the present invention can be used as an intermediate step. That is, some layer operations may first derive the shape set inputs to the methods of FIGS. 2–10, which are performed, and further layer operations may manipulate the outputs further before anything is presented to the user.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A method for performing an electrical distance check comprising the steps of:
    a) growing each of a plurality of seeds to generate a first shape set that includes a plurality of shapes;
    b) determining frontier geometries for each shape within said first shape set;
    c) saving said frontier geometries determined in step b);
    d) growing said frontier geometries to generate a second shape set that includes a plurality of shapes;
    e) determining frontier geometries for each shape resulting from step d);
    f) saving said frontier geometries determined in step e); and
    g) replacing said first shape set with said second shape set and continuing to perform steps d) through g) as long as steps d) through g) produce at least one frontier geometry.

2. The method of claim 1, wherein said frontier geometries comprise frontier edges.

3. The method of claim 2 wherein frontier edges are determined in step b) by dropping those portions of the edges of the shapes resulting from step a) that extend beyond a boundary shape set and wherein frontier edges are determined in step e) by dropping those portions of the edges of the shapes resulting from step d) that overlap the shapes within said first shape set and dropping those portions of the edges of the shapes resulting from step d) that extend beyond a boundary shape set.

4. The method of claim 2 wherein frontier edges are determined in step b) by dropping those portions of the edges of the shapes resulting from step a) that overlap said boundary shape set and wherein frontier edges are determined in step e) by dropping those portions of the edges of the shapes resulting from step d) that overlap the shapes within said first shape set and dropping those portions of the edges of the shapes resulting from step d) that overlap said boundary shape set.

5. The method of claim 1 wherein steps a) through g) are performed to reach a first edge boundary by growth to a last full growth step and by the growth of a less than full growth step, said method further comprising the step of:
    h) performing steps d) through g), beginning with said last full growth step, to reach a second edge boundary.

6. The method of claim 5 wherein step h) is repeated to reach any number of additional edge boundaries for determining additional edge boundaries.

7. The method of claim 1 wherein steps a) through g) are performed to reach a first edge boundary, by growth to a last full growth step and by the growth of a less than full growth step, to determine a first beyond region, said method further comprising the step of:
    h) determining a beyond region by performing steps d) through g), beginning with said last full growth step, to reach a second edge boundary.

8. The method of claim 7 wherein step h) is repeated to reach any number of additional edge boundaries for determining additional beyond regions.

9. The method of claim 1 wherein steps a) through g) are performed to reach a first edge boundary by growth to a last full growth step and by the growth of a less than full growth step to determine a first between region, said method further comprising the step of:
    h) determining a between region by performing steps d) through g), beginning with said last full growth step, to reach a second edge boundary.

10. The method of claim 9 wherein step h) is repeated to reach any number of additional edge boundaries to determine additional between regions.

11. The method of claim 1, wherein said frontier geometries comprise frontier polygons.

12. The computer readable medium having stored thereon instructions which when executed on a general purpose processor execute a method for performing an electrical distance check comprising the steps of:
    a) growing each of a plurality of seeds to generate a first shape set that includes a plurality of shapes;
    b) determining frontier geometries for each shape within said first shape set;
    c) saving said frontier geometries determined in step b);
    d) growing at least some of said frontier geometries to generate a second shape set that includes a plurality of shapes;
    e) determining frontier geometries for each shape within said second shape set;

f) saving said frontier geometries determined in step e); and g) replacing said first shape set with said second shape set and continuing to perform steps d) through g) as long as steps d) through g) produce at least one frontier geometry.

13. The computer readable medium of claim 12, wherein said frontier geometries comprise frontier polygons.

14. The computer readable medium of claim 13 wherein frontier polygons are determined in step b) by dropping those portions of the shapes resulting from step a) that extend beyond a boundary shape set and wherein frontier polygons are determined in step e) by dropping those portions of the shapes resulting from step d) that overlap the shapes within said first shape set and dropping those portions of the shapes resulting from step d) that extend beyond a boundary shape set.

15. The computer readable medium of claim 13 wherein frontier polygons are determined in step b) by dropping those portions of the shapes resulting from step a) that overlap said boundary shape set and wherein frontier polygons are determined in step e) by dropping those portions of the shapes resulting from step d) that overlap the shapes within said first shape set and dropping those portions of the shapes resulting from step d) that overlap said boundary shape set.

16. The computer readable medium of claim 12 wherein steps a) through g) of said method are performed to reach a first edge boundary by growth to a last full growth step and by the growth of a less than full growth step, said method further comprising the step of:

h) performing steps d) through g), beginning with said last full growth step, to reach a second edge boundary.

17. The computer readable medium of claim 16 wherein step h) of said method is repeated to reach any number of additional edge boundaries for determining additional edge boundaries.

18. The computer readable medium of claim 12 wherein steps a) through g) of said method are performed to reach a first edge boundary by growth to a last full growth step and by the growth of a less than full growth step to determine a first beyond region, said method further comprising the step of:

h) determining a beyond region by performing steps d) through g), beginning with said last full growth step, to reach a second edge boundary.

19. The computer readable medium of claim 18 wherein step h) of said method is repeated to reach any number of additional edge boundaries for determining additional beyond regions.

20. The computer readable medium of claim 12 wherein steps a) through g) of said method are performed to reach a first edge boundary by growth to a last full growth step and by the growth of a less than full growth step to determine a first between region, said method further comprising the step of:

h) determining a between region by performing steps d) through g), beginning with said last full growth step, to reach a second edge boundary.

21. The computer readable medium of claim 20 wherein step h) to ACME of said method is repeated to reach any number of additional edge boundaries for determining additional between regions.

22. The computer readable medium of claim 12, wherein said frontier geometries comprise frontier edges.

23. In a computer system including a processor coupled to a bus for storing information, a computer implemented method for performing an electrical distance check comprising the steps of:

a) growing each of a plurality of seeds to generate a first shape set that includes a plurality of shapes;

b) determining frontier geometries for each shape within said first shape set;

c) saving said frontier geometries determined in step b);

d) growing said frontier geometries to generate a second shape set that includes a plurality of shapes;

e) determining frontier geometries for each shape resulting from step d);

f) saving said frontier geometries determined in step e); and g) replacing said first shape set with said second shape set and continuing to perform steps d) through g) as long as steps d) through g) produce at least one frontier geometry.

24. The computer-implemented method of claim 23 wherein frontier geometries are determined in step b) by dropping those portions of the shapes resulting from step a) that extend beyond a boundary shape set and wherein frontier geometries are determined in step e) by dropping those portions of the shapes resulting from step d) that overlap the shapes within said first shape set and dropping those portions of the shapes resulting from step d) that extend beyond a boundary shape set.

25. The computer-implemented method of claim 23 wherein frontier geometries are determined in step b) by dropping those portions of the shapes resulting from step a) that overlap said boundary shape set and wherein frontier geometries are determined in step e) by dropping those portions of the shapes resulting from step d) that overlap the shapes within said first shape set and dropping those portions of the shapes resulting from step d) that overlap said boundary shape set.

26. The computer-implemented method of claims 23 wherein said frontier geometries are represented by a plurality of points that are stored in the form of Cartesian coordinates that indicate the location of each of said points.

* * * * *